(12) United States Patent
Surendranath et al.

(10) Patent No.: US 11,092,482 B2
(45) Date of Patent: Aug. 17, 2021

(54) LEAKAGE COMPENSATION FOR A DETECTOR

(71) Applicant: TEXAS INSTRUMENTS INCORPORATED, Dallas, TX (US)

(72) Inventors: Nagesh Surendranath, Bangalore (IN); Rakul Viswanath, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 120 days.

(21) Appl. No.: 16/277,653

(22) Filed: Feb. 15, 2019

(65) Prior Publication Data

US 2020/0264039 A1 Aug. 20, 2020

(51) Int. Cl.
*G01J 1/44* (2006.01)
*H03F 1/26* (2006.01)
*H03F 3/08* (2006.01)

(52) U.S. Cl.
CPC .............. *G01J 1/44* (2013.01); *H03F 1/26* (2013.01); *H03F 3/08* (2013.01); *G01J 2001/444* (2013.01); *H03F 2200/129* (2013.01); *H03F 2200/156* (2013.01); *H03F 2200/171* (2013.01); *H03F 2200/228* (2013.01); *H03F 2200/414* (2013.01)

(58) Field of Classification Search
CPC . H04N 5/2176; H04N 5/361; G01J 2001/444; H03F 1/26
See application file for complete search history.

(56) References Cited

U.S. PATENT DOCUMENTS

| 3,684,378 A | 8/1972 | Lord |
| 10,180,351 B2 | 1/2019 | Viswanath et al. |
| 2011/0031419 A1* | 2/2011 | Fukui ................. G01N 21/4738 250/574 |
| 2017/0160129 A1 | 6/2017 | Viswanath et al. |
| 2020/0264039 A1 | 8/2020 | Surendranath et al. |

OTHER PUBLICATIONS

Szczygiel: "Krummenacher feedback analysis for High-count-rate semiconductor pixel detector readout." Mixed Design of Integrated Circuits and systems (MIXDES), 2010 Proceedings of the 17th International Conference, IEEE, 2010.

* cited by examiner

*Primary Examiner* — Thanh Luu
(74) *Attorney, Agent, or Firm* — John R. Pessetto; Charles A. Brill; Frank D. Cimino

(57) ABSTRACT

A circuit for use in a system that includes a detector, wherein the circuit comprises an input terminal to receive a detector signal from the detector external to the circuit, the detector signal to include an error charge corresponding to a leakage current. The circuit further comprises an amplifier coupled to the input terminal to receive input signals corresponding to the detector signal, including the error charge applied to an input of the amplifier. The circuit further comprises a feedback path coupled across the amplifier, wherein the feedback path comprises a first switch coupled across a leakage resistor and to a leakage capacitor for discharging a feedback compensation charge from the leakage capacitor and onto the input of the amplifier to substantially cancel the error charge.

13 Claims, 5 Drawing Sheets

LEAKAGE COMPENSATION FOR A DETECTOR

BACKGROUND

A detector is a type of circuit that can detect various forms of energy and converts that energy to current or charge.

One type of detector is a direct conversion detector that converts photon energy to current or charge. Another type of detector can be a switched capacitor detector that converts voltage to current or charge. A detector that converts photon energy can be used in a photon counting system. Similar to photon detectors, switched capacitor detectors are used to detect an input voltage.

SUMMARY

In accordance with at least one example of the disclosure, a circuit for use in a system that includes a detector, wherein the circuit comprises an input terminal to receive a detector signal from the detector external to the circuit, the detector signal to include an error charge corresponding to a leakage current. The circuit further includes an amplifier coupled to the input terminal to receive input signals corresponding to the detector signal, including the error charge applied to an input of the amplifier. The circuit further comprises a feedback path coupled across the amplifier, wherein the feedback path comprises a first switch coupled across a leakage resistor and to a leakage capacitor for discharging a feedback compensation charge from the leakage capacitor and onto the input of the amplifier to substantially cancel the error charge.

In accordance with at least another example of the disclosure, a circuit for use in a system that includes a detector, wherein the circuit comprises an input terminal to receive a detector signal from the detector external to the circuit, the detector signal to include an error charge corresponding to a leakage current. The circuit further includes an amplifier coupled to the input terminal, and having an amplifier input and an amplifier output. The circuit further comprises a feedback capacitor coupled to the amplifier input and the amplifier output, and a feedback path coupled to the amplifier input and the amplifier output, wherein the feedback path comprises a first switch coupled across a leakage resistor and to a leakage capacitor. The first switch is responsive to an event signal to close and discharge a feedback leakage current through the first switch and onto the amplifier input.

In accordance with at least another example of the disclosure, a leakage compensation system comprises a detector configured to produce a leakage current at an output of the detector, and an amplifier having an amplifier input and an amplifier output, wherein the amplifier input is coupled to the output of the detector. The leakage compensation system further comprises a feedback path coupled across the amplifier and comprising a first switch coupled across a leakage resistor and to a leakage capacitor for discharging a feedback leakage current through the feedback path and upon the output of the detector substantially equal to the leakage current.

BRIEF DESCRIPTION OF THE DRAWINGS

For a detailed description of various examples, reference will now be made to the accompanying drawings in which.

DETAILED DESCRIPTION

A detector that converts photon energy can be used in a photon counting system within, for example, a Computed Tomography (CT) application. Photons of each pixel within a view can be counted to provide a charge packet at the output of the detector. Multiple charge packets can be delivered within a specified time, known as "dead time," and are counted as a single packet. Each channel corresponding to a pixel of a single view within the CT system can therefore be counted to discern one pixel from that of another within the view. Photon counting systems with a longer dead time are likely to cause more error in the photon count. Hence, it is desirable that the dead time be held as short as possible, and that the detector be reverse biased with a voltage exceeding, for example, several thousand volts. A large reverse bias can cause current to nonetheless flow through the detector, including when no photons are incident on the detector. This current is often referred to as "dark current," which can be expressed as leakage current through the detector when photons are absent and not substantially incident on the detector.

Similar to photon detectors, switched capacitor detectors used to detect an input voltage can also undergo leakage current during not only the hold time of a clocking signal applied to the switched capacitors, but also during the preceding sample time. The leakage current of a detector, whether detecting photons, voltage, current, or the absence thereof, affects the charge at the output of a detector. That charge, when applied to, for example, an amplifier, can adversely affect the dynamic range and energy resolution capabilities of that amplifier. For example, if the amplifier is coupled to sense charge at an output of the detector (or switched capacitors), and the amplifier is coupled as an integrator, dynamic range and energy resolution errors occur within the amplifier that will cause the amplifier output to be skewed incorrectly compared to the input.

Regardless of the application, the charge applied to an input of the amplifier that results from leakage current or charge within the detector is to be compensated or offset, in order to mitigate the dynamic range and energy resolution errors. The compensation may occur through a feedback leakage current and a feedback compensation charge from the output of the amplifier to the input of the amplifier to compensate, cancel, or offset any error charge at the amplifier input that is caused by leakage at the detector output.

Figure 1:
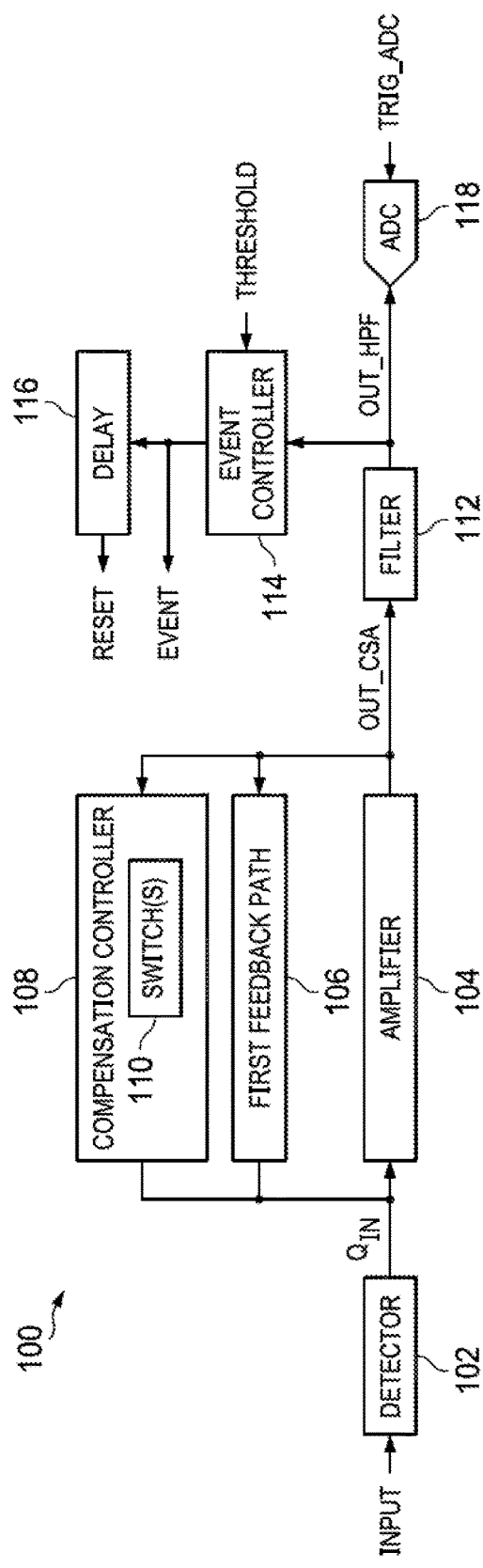
FIG. 1 shows a block diagram of a detector system with leakage compensation configured to compensate for charge or current leakage in a detector in accordance with various examples.

FIG. 1 depicts a detector system 100 including leakage compensation configured to compensate for current or charge leakage in a detector 102, in accordance with various examples. Detector 102 can receive input energy in the form of photons or electrical energy, and can produce a charge $Q_{IN}$ to an amplifier 104. Output $Q_{IN}$ is dependent upon the input energy, as well as any leakage (current and/or charge) within detector 102. The amount of leakage can change with time or temperature and, in the case where detector 102 is a photon counting detector, can also change based on incident photon flux. There may be instances, however, where substantially no photon flux is present and yet, leakage current in the form of dark current can exist, thereby affecting $Q_{IN}$. If detector 102 is a switched capacitor detector that detects, for example, voltage during a sample phase of the clock, then the detector 102 may nonetheless discharge the sample voltage during the sample phase through a current leakage path, also affecting $Q_{IN}$ at the output of detector 102, as read by the input of amplifier 104.

Amplifier 104 can amplify and/or integrate charge or current applied to an input of amplifier 104 as measured on the output of amplifier 104. If detector 102 is used in a photon counting application, detector 102 receives optical energy and produces current at the input of amplifier 104. Even when optical energy is absent, dark current or leakage current is nonetheless placed at the input of amplifier 104. Dark current is unwanted current that is unrelated to the photon current associated with incident photons arriving at detector 102. When photons are present at the input, detector 102 nonetheless produces leakage current as well as photon current with corresponding charge $Q_{IN}$ at the output of detector 102 and upon the input of amplifier 104. Amplifier 104 generates an output signal OUT_CSA that corresponds to photons that generate photon current and unwanted dark current (leakage current).

If detector 102 is a switched capacitor front-end sampling an input voltage, and thereafter holds that voltage upon amplifier 104, the sample phase will nonetheless incur leakage current that draws charge from a capacitor at the output of detector 102, similar to a photon detection application. The amplifier 104, operating with a switched capacitor front-end (switched-capacitor amplifier), amplifies the charge/current, including the unwanted leakage current and the effect of that leakage current on $Q_{IN}$.

The leakage current at the output of detector 102 and onto the input of amplifier 104 is fed back through a first feedback path 106. The OUT_CSA at the output of amplifier 104 is sent through the first feedback path 106 to the input of amplifier 104. According to one example, first feedback path 106 can include a feedback capacitor in the first feedback path 106. The feedback capacitor is coupled to integrate the current received from detector 102. If the current received from detector 102 contains a leakage current, then that leakage current can be integrated by the feedback capacitor within the first feedback path 106.

Amplifier 104 can include two inputs, with one input coupled to receive the output from detector 102 and first feedback path 106. The other input can receive a bias voltage, where amplifier 104 produces an output bias voltage to first feedback path 106 and compensation controller 108. The output bias voltage can mitigate common mode voltage at the input of amplifier 104. In one example, the input bias voltage and the output bias voltage can be set to the same voltage level or, in another example, set to different voltage levels via a bias circuit. Alternatively, the bias circuit can adjust the output bias voltage at OUT_CSA at the input of compensation controller 108 based on detected changes in leakage current from detector 102. The detected changes are based in part on detected changes in temperature, changes in time, changes in leakage current that may arise due to electrostatic discharge at the input of detector 102, or upon the sample and hold switches at the input of detector 102.

The compensation controller 108, similar to first feedback path 106, is included in a second feedback path. The second feedback path with compensation controller 108 receives the output from amplifier 104 and feeds the input of amplifier 104. Compensation controller 108 generates a leakage compensation signal to offset, cancel, or compensate for, the leakage current corresponding to the dark current or leakage current within detector 102 when no photons exist at the input. Compensation controller 108 includes at least one switch, and preferably two switches 110 that toggle to store leakage information corresponding to the leakage current and thereafter apply that leakage information to the input of amplifier 104 to cancel or offset the leakage current (or error charge $Q_{ERR}$ corresponding to the leakage current) arising from the output of detector 102.

The leakage compensation system 100 can also include a filter 112 coupled to receive the output (OUT_CSA) from amplifier 104. Filter 112 can be arranged in a high-pass configuration with, for example, a capacitor coupled to the output of amplifier 104 and a resistor coupled between that capacitor and a ground supply. A high-pass configuration can include other active or passive components, so that relatively high frequency transitions upon the OUT_CSA output are allowed to pass through filter 112 as signal OUT_HPF.

Coupled to receive the output from filter 112 can be an event controller 114. Event controller 114 and filter 112 can be used in a photon counting application. When photons are detected by detector 102, OUT_HPF increases in value. Once the OUT_HPF signal increases beyond a threshold, event controller 114 generates an EVENT (event) signal. The event signal can be applied to the compensation controller 108 to control switches 110. For example, absence of an event will transition the switches 110 to a first state, whereas the presence of an event will transition switches 110 to a second, opposing, state. A delay circuit 116 can be programmed with either a fixed or variable time delay relative to the event signal. For example, when the event signal is generated, delay circuit 116 generates a time delay ($T_{DELAY}$) that can be fixed or variable. After expiration of $T_{DELAY}$, a RESET (reset) signal is generated. The reset signal can be applied to the first feedback path 106, and specifically to one or more switches within the first feedback path 106. For example, the reset signal can be used to discharge the feedback capacitor in the first feedback path 106.

An Analog to Digital Converter (ADC) 118 can be used in a photon counting application. ADC 118 can record the photon energy level of the filtered output signal OUT_HPF. The combination of ADC 118, event controller 114, and the charge sensing of amplifier 104 provides counting of incoming photons on detector 102 to discriminate charge packets into different energy thresholds, or bins. The different energy thresholds can be independently programmed for each pixel. Energies of each event are compared to the thresholds, and counts are stored in digital counters for the duration of each event. ADC 118 can be triggered before each reset, thereby converting the OUT_CSA output. The ADC conversion is triggered via the TRIG_ADC signal. ADC 118 not only discriminates between energy levels for each event, but also operates as a quantizer that samples OUT_HPF when determining the energy bin for that sample. ADC 118 can be configured with comparators and a Resistive Digital to Analog Converter (RDAC). For example, if there are six energy bins being discriminated, the RDAC provides six voltage thresholds applied to six comparators. The six different voltage thresholds can be controlled by six threshold registers coupled to the input of the RDAC. ADC 118 can be configured in multiple different arrangements, with active and passive components, different from comparators and an RDAC. As long as ADC 118 can quantize samples and discriminate those samples into different energy bins, any modifications to its circuit arrangement are acceptable.

At least part of the functionality of filter 112, event controller 114, delay circuit 116 and ADC 118 is applicable to a photon counting application. A photon counting application counts photon packets at the input of detector 102 and determines that count using ADC 118. The photon count occurs during the time when an event signal is generated (asserted) from event controller 114. If the input signal upon detector 102 contains substantially no photons, so that only dark currents are present at the input to detector 102, then OUT_HPF will not rise to a voltage level above a predetermined threshold voltage and the event signal will not be generated. Moreover, the photon count will not be quantized and discriminated into different bins by ADC 118.

Many of the components of leakage compensation system 100, such as event controller 114, filter 112, and ADC 118 are applicable to photon counting. If the input signal upon detector 102 is electrical energy rather than photon energy, and detector 102 is a switched capacitor front end to a switched capacitor amplifier 104, then leakage compensation system 100 need not contain filter 112, event controller 114, delay circuit 116 or ADC 118. The event signal, as well as the reset signal, can be derived from sample and hold phases of an equal duty cycle clocking signal. The reset signal can be eliminated if the sample and hold phases are applied to a feedback capacitor within first feedback path 106. Thus, elements 112, 114, 116, and 118 coupled to OUT_CSA can be eliminated in a switched capacitor amplifier arrangement where the input signal receives electrical energy (voltage or current) to be sampled rather than photons to be counted.

Figure 2:
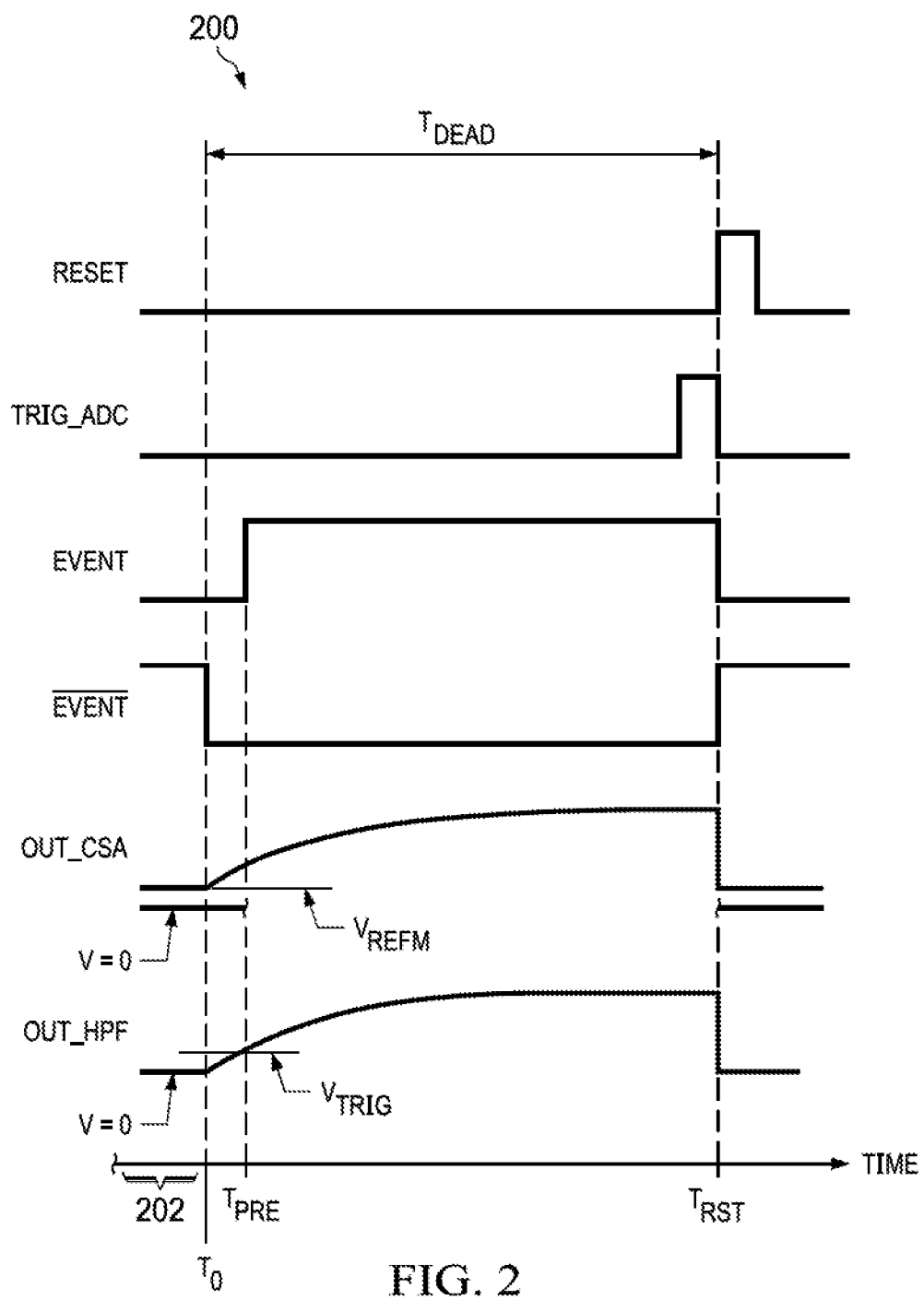
FIG. 2 shows a timing diagram of signals within the detector leakage compensation system in accordance with various examples.

FIG. 2 illustrates a timing diagram 200 of signals within the detector system 100 with leakage compensation used in a photon counting application, in accordance with various examples. When there is $\overline{\text{EVENT}}$ (no event) at time 202, OUT_CSA starts at a relatively low voltage level $V_{REFM}$ set by the compensation controller circuit 108. At time $T_0$, when photon energies begin to arrive on the input signal, OUT_CSA rises from $V_{REFM}$, and OUT_HPF begins to rise from substantially a zero voltage level (V=0). After OUT_HPF rises above $V_{TRIG}$, which is a pre-determined threshold voltage, an event signal (EVENT) is generated at $T_{PRE}$. Then, at time=$T_0+T_{PRE}+T_{POST}$ ($T_{DEAD}$), the event signal is terminated and a reset signal (RESET) is generated at time $T_{RST}$. However, prior to $T_{RST}$, the TRIG_ADC signal is applied to ADC 118 and the quantizer of ADC 118 will sample the OUT_HPF charge packets of the photon current to determine the photon count number of the charge packets delivered within the dead time, or $T_{DEAD}$. After amplifier 104 is reset via the reset signal, amplifier 104 is ready to receive the next event. This sequence continues until the end of the view.

The pre-detection time $T_{PRE}$ depends on the initial rate of the incoming charge from detector 102, the delays in the amplifier 104 and event controller 114, and also on the voltage $V_{TRIG}$. The post-detection time $T_{POST}$ between $T_{PRE}$ and $T_{RST}$ allows the amplifier 104 to acquire the charge packets from detector 102 and can be programmed by a user. During the dead time duration $T_{DEAD}$, charge packets arrive from the detector 102, and are accumulated and binned by ADC 118 upon receiving the TRIG_ADC signal.

The timing diagram 200, and corresponding signals shown, can be applicable to photon counting applications. However, it is understood that certain ones of the signals shown can be applicable to a switched capacitor application, and specifically a switched capacitor amplifier with a switched capacitor detector front end. A switched capacitor amplifier, similar to a photon counting architecture, can include a compensation controller 108 with switches 110 for storing compensation information during a sample phase (no event), while therefore forwarding compensation information to offset or cancel leakage current and/or charge during the subsequent hold phase (event detection).

Figure 3:
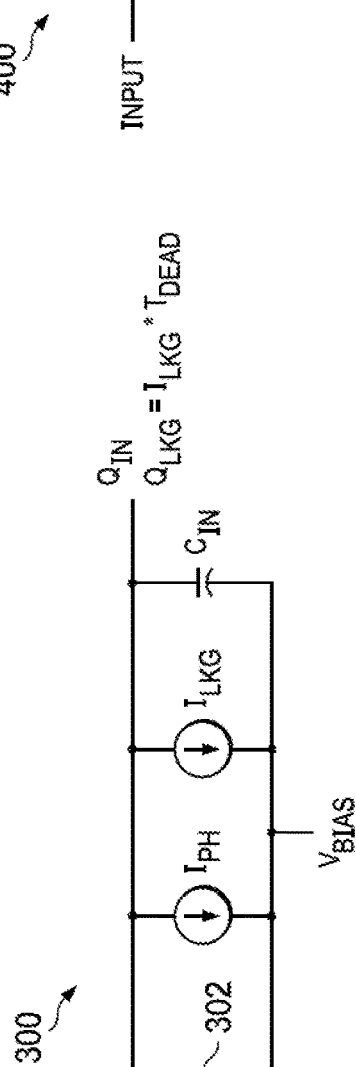
FIG. 3 shows a detector configured to convert photon energy to current and/or charge in accordance with various examples.

FIG. 3 shows a detector 300 configured to convert optical energy to current and/or charge in accordance with various examples. Detector 300 can include a semiconductor device that converts optical energy, or photons, into an electrical current or charge. Current or charge is generated when photons are absorbed in a photodiode 302. Multiple charge packets are generated as charge $Q_{IN}$, and counted as a single packet during $T_{DEAD}$. To decrease detector 300 dead time, the response time is lowered by reverse biasing the photodetector 302 with a bias voltage $V_{BIAS}$ near 1 kV, and up to 2 kV. As a result, significant current will flow through photodiode 302 even when substantially no photons are incident on the photodiode 302. Photon current, shown as $I_{PH}$, results from photons on photodiode 302. The leakage current $I_{LKG}$ results from reverse biasing, even with no photons incident on photodiode 302, so that the total current from detector 300 results from $I_{PH}$ and the dark current or leakage current $I_{LKG}$. Leakage current from detector 300, if not compensated for during no event times, can cause dynamic range and energy resolution issues. The dark current, or leakage current, $I_{LKG}$, will cause charge accumulation on the input capacitor $C_{IN}$. Leakage current $I_{LKG}$, and the resulting leakage charge $Q_{LKG}$, can be compensated for during the dead time, wherein $Q_{LKG}=I_{LKG}*T_{DEAD}$.

Figure 4:
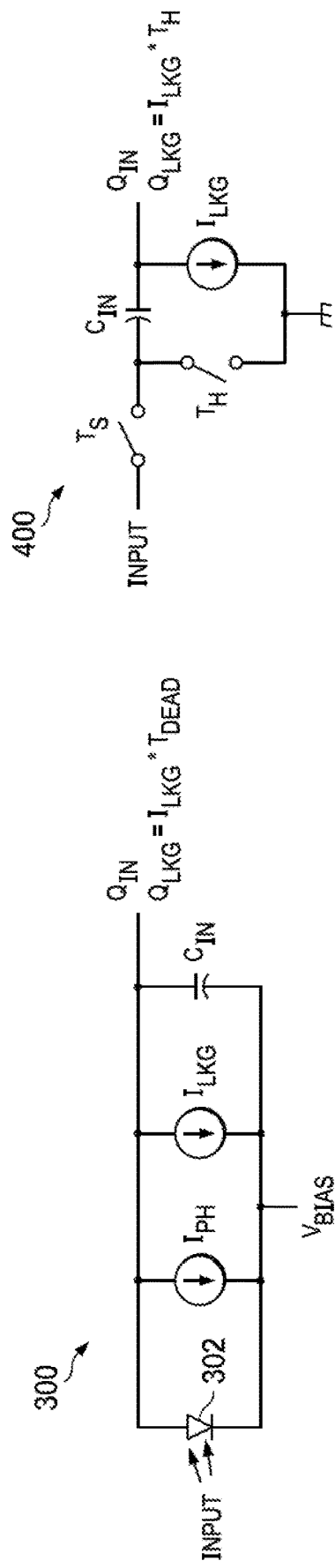
FIG. 4 shows a detector configured to convert electrical energy to current and/or charge in accordance with various examples.

FIG. 4 shows a detector 400 configured to convert electrical energy to current and/or charge in accordance with various examples. Detector 400 can include active and passive components configured at the switched-capacitor front-end of a switched-capacitor amplifier. A first switch of detector 400 can be closed during a sample time $T_S$, and a second switch of detector 400 can be closed during a hold time $T_H$. The first switch $T_S$ is coupled between the input signal and an input capacitor $C_{IN}$. The second switch $T_H$ can be coupled between capacitor $C_{IN}$ and a ground supply. When the first switch is closed during the sample time $T_S$, capacitor $C_{IN}$ is charged. However, during the sample time in which the switch $T_S$ is closed, the charge will nonetheless leak from capacitor $C_{IN}$ as leakage current $I_{LKG}$. The leakage charge (leakage current) will be reflected on the output of detector 400 as $Q_{IN}$.

$Q_{IN}$ of detector 400, as well as $Q_{IN}$ of detector 300, corresponds to the charge at the input of amplifier 104. To compensate for $I_{LKG}$ and $Q_{LKG}$ corresponding to the leakage current, or error charge, during a hold phase of a clocking signal subsequent to a sample phase, the error charge, or $Q_{LKG}$ (sometimes referred to as $Q_{ERR}$) is compensated for by an amount of $I_{LKG}*T_H$. The error charge $Q_{LKG}$ of $Q_{IN}$ is canceled or offset by the compensation controller 108 (FIG. 1) in the second feedback path to mitigate any integration of leakage current on the feedback capacitor $C_{FB}$ within the first feedback path 106 (FIG. 1). Offsetting or canceling the charge error of $Q_{LKG}$ or the leakage current $I_{LKG}$ whether in a photon detector 300 or a switched capacitor detector 400 mitigates dynamic range and energy resolution issues of either a photon counting application or a switched capacitor amplifier application.

Figure 5:
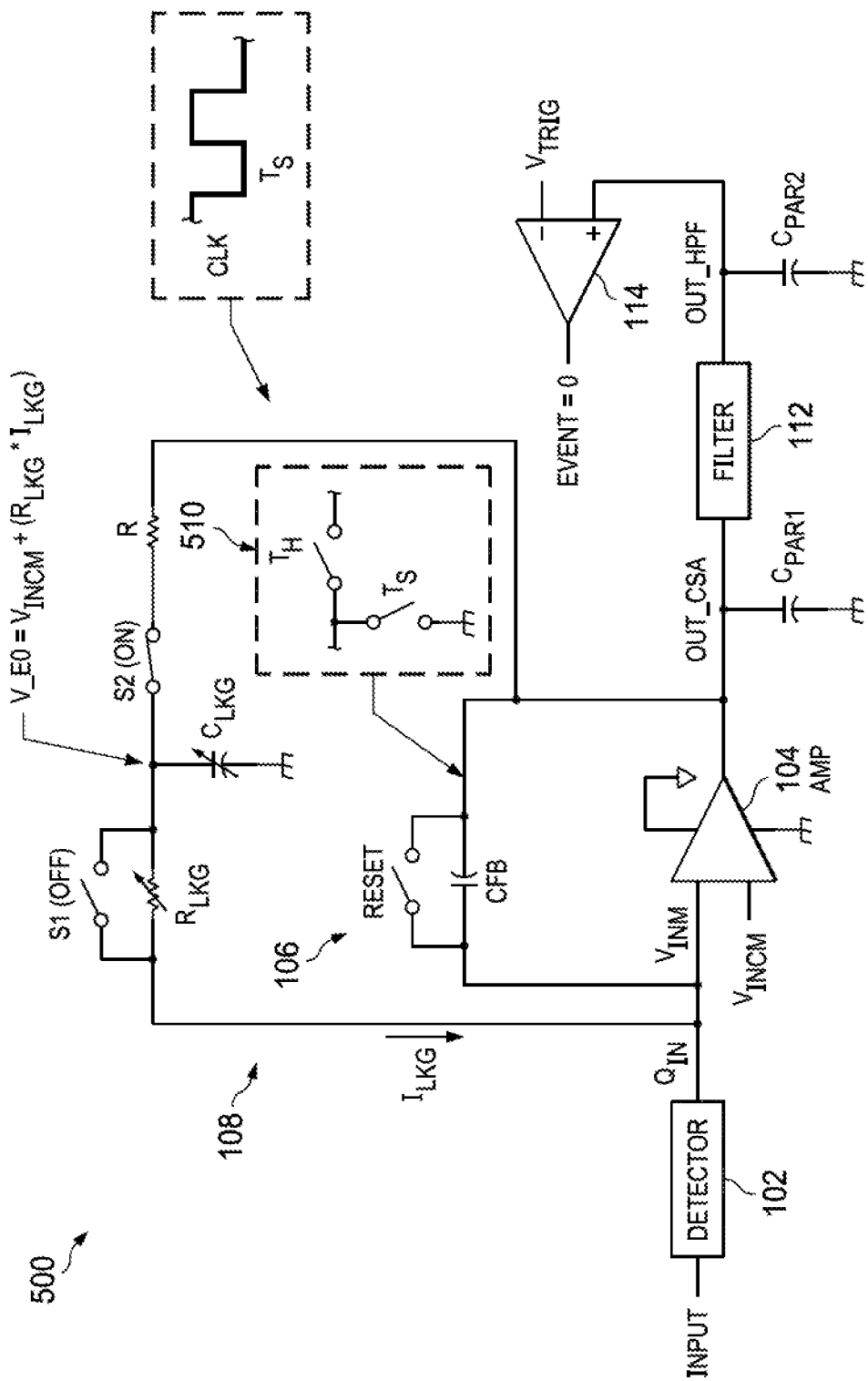
FIG. 5 shows a circuit diagram of a leakage compensation circuit including switches actuated absent an event in accordance with various examples.
Figure 6:
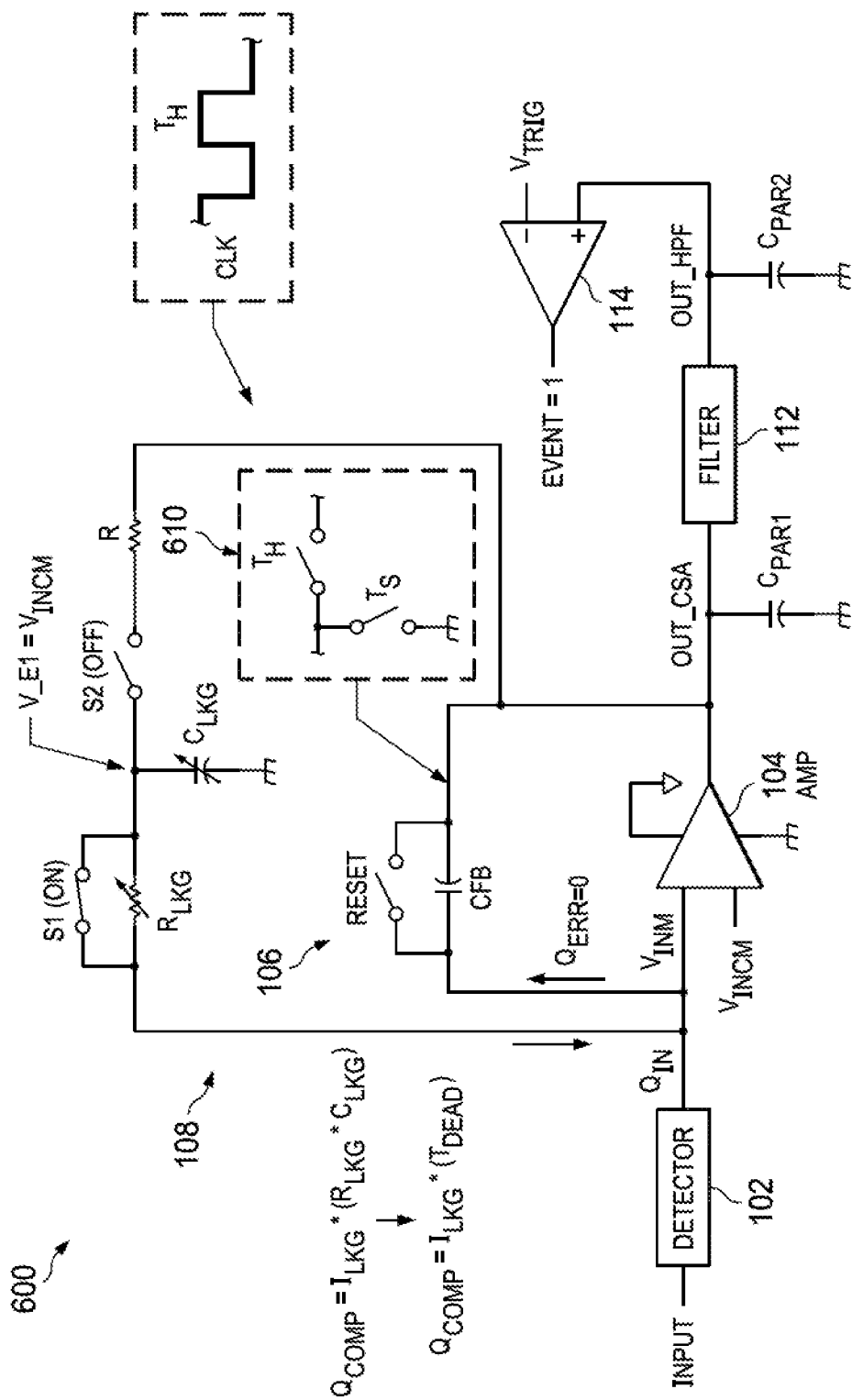
FIG. 6 shows a circuit diagram of a leakage compensation circuit including switches actuated during an event in accordance with various examples.

FIGS. 5 and 6 illustrate the configuration of the a leakage compensation circuit in accordance with various examples, including a second feedback path with compensation controller 108, including switches S1 and S2 configured for (FIG. 5) EVENT=0 (no event detection), and (FIG. 6) EVENT=1 (event detection).

FIG. 5 shows a circuit diagram of a leakage compensation circuit 500, coupled to detector 102, and having switches S1 and S2 in the second feedback path that are selectively actuated in the absence of an event in accordance with various examples. Switches S1 and S2 comprise switches 110 (FIG. 1) within a compensation controller 108. Compensation controller 108 is coupled in a second feedback path across amplifier 104, as well as across first feedback path 106.

Referring also to FIG. 2, when toggling a RESET (reset) signal, charge across the feedback capacitor $C_{FB}$ is reduced to a common voltage, that voltage value being $V_{REFM}$. The output from amplifier 104, or OUT_CSA, is maintained at $V_{REFM}$ when no event is detected from the event controller 114, shown configured as a comparator. Moreover, the output from filter 112 will be maintained at substantially the ground supply voltage since the DC component of $V_{REFM}$ is removed by filter 112 at the output of the filter 112. Parasitic capacitance can exist on the conductors which bear OUT_CSA and OUT_HPF signals, the parasitic capacitance is shown as $C_{PAR1}$, $C_{PAR2}$.

During the time duration in which no event is detected by event controller 114 (EVENT=0) due to OUT_HPF being less than the predetermined $V_{TRIG}$, information corresponding to the leakage current $I_{LKG}$ that exists in detector 102 is fed back from amplifier 104 output to amplifier 104 input by the compensation controller 108. The charge corresponding to the leakage current when no event exists is shown as $V_{E0} = V_{INCM} + (R_{LKG} * I_{LKG})$.

Information corresponding to the leakage current at EVENT=0 can be $V_{E0}$ upon leakage capacitor $C_{LKG}$ as shown when the first switch S1 is off and second switch S2 is on during the time in which no event is present. The first switch S1 and the second switch S2 remain off and on, or disconnected and connected, respectively, when no event is present at the output of event controller 114. The configuration of the first and second switches S2 and S2, respectively, allows $I_{LKG}$ to traverse a second feedback path of compensation controller 108 and through a voltage divider network or $R_{LKG}$ and R. $V_{INM}$ on capacitor $C_{LKG}$ is substantially equal to $V_{INCM}$ on the input of amplifier 104, and the stored leakage information during a non-event can be equal to $V_{INCM} + (R_{LKG} * I_{LKG})$. $V_{INCM}$ can be a predefined voltage or bias voltage, similar to $V_{TRIG}$ also being a predefined voltage or bias voltage.

The leakage current $I_{LKG}$ traversing the compensation controller 108 feedback path through the resistor divider network $R_{LKG}$ and R during a non-event is substantially equal to the leakage current $I_{LKG}$ within detector 102. As leakage current $I_{LKG}$ traverses the compensation controller 108, current caused by $I_{LKG}$ arrives exclusively from the detector 102 and not from the feedback capacitor $C_{FB}$ of the first feedback path 106. This will prevent integration skew on OUT_CSA during non-event periods. During the feedback of $I_{LKG}$, charge corresponding to the leakage current will be stored on $C_{LKG}$ when, for example, no photon energy is incident on detector 102.

Also shown in FIG. 5, in phantom, are sample and hold switches $T_S$ and $T_H$ within block 510. Sample and hold switches $T_S$ and $T_H$ can be coupled within the first feedback path 106 if leakage compensation circuit 500 is configured as a switched-capacitor amplifier circuit. If configured as a switched-capacitor amplifier circuit, then filter 112 and event controller 114 can be eliminated and, instead of a non-event toggling the first and second switches S1 and S2, as shown, a sample duration $T_S$ of a clocking signal can open the first switch S1 while closing the second switch S2 to charge $C_{LKG}$ with the voltage as shown, or $V_{INCM}$ ($R_{LKG} * I_{LKG}$). When configured as a switched capacitor amplifier circuit, the leakage compensation circuit 500 and specifically the compensation controller 108, operates similar to a photon counting configuration. Adding sample and hold switches in the first feedback loop 106, and operating those switches, as well as the first and second switches S1 and S2 in the compensation controller 108 using a clocking signal is substantially the same as a leakage detection circuit 500 operating as a photon counting circuit. Instead of a non-event of a photon counting circuit, a sample phase or sample event of a clocking signal operates the first and second switches S1 and S2 in similar fashion.

FIG. 6 shows a circuit diagram of a leakage compensation circuit 600 including first and second switches S1 and S2 within compensation controller 108 in the second feedback path, selectively actuated during an event. When an event occurs, OUT_CSA will increase beyond $V_{REFM}$, and OUT_HPF will increase beyond $V_{TRIG}$, causing an event signal (EVENT=1) to be generated at the output of event controller 114. The presence of an event signal, or specifically a logic one value of an event signal, will cause the first and second switches S1 and S2, respectively, to toggle. S1 will transition to a closed or on state, and S2 will toggle to an open or off state. With switch S2 being open, the feedback of $I_{LKG}$ is terminated. However, with switch S1 being closed, or on, the charge previously stored on $C_{LKG}$ will discharge onto $Q_{IN}$. Moreover, the stored voltage on $C_{LKG}$ (V_E1) will decrease from $V_{INCM}$ ($R_{LKG} * I_{LKG}$, to $V_{INCM}$. As the voltage upon $C_{LKG}$ is decreased, that decrease will occur throughout the duration of the dead time, in which the photons are detected by detector 102. Commensurate with the decrease in voltage, charge from $C_{LKG}$, or feedback compensation charge $Q_{COMP}$ will transfer from $C_{LKG}$ to $Q_{IN}$. The amount of charge transferal of the feedback compensation charge $Q_{COMP}$ will be equal to $I_{LKG}$ LKG*$C_{LKG}$. The time constant $R_{LKG} * C_{LKG}$ can be equal to the dead time, or $T_{DEAD}$. One mechanism in which to make the time constant $R_{LKG} * C_{LKG}$ equal to the dead time is to configure $C_{LKG}$ as a variable capacitor and/or $R_{LKG}$ as a variable resistor.

A variable capacitor can be configured with multiple capacitors coupled in parallel, and with one or more of those capacitors having a switch coupled to opposite plates of the capacitor for shorting those plates. A variable resistor can be configured with a series or parallel combination of resistors, where one or more resistors in the series or parallel combination can be shorted or opened with a switch. Similar to the first and second switches S1 and S2, switches in the variable capacitor $C_{LKG}$ or the variable resistor $R_{LKG}$ can be transistors actuated through voltages placed on the gate of those transistors. The variable capacitor $C_{LKG}$ can, for example, vary twenty to thirty percent from, for example, 8fF, and variable resistor $R_{LKG}$ can either be fixed or can vary twenty to thirty percent from, for example, 2 m ohms. Resistor R can be a fixed resistor, with a resistance value substantially the same as $R_{LKG}$ at, for example, a median value of 2 m ohms.

Regardless of the values for $R_{LKG}$, R and/or $C_{LKG}$, provided the product of $R_{LKG}$ and $C_{LKG}$ are chosen approximately within an appropriate accuracy of the desired dead time, the error charge at $Q_{IN}$ ($Q_{LKG}$ or $Q_{ERR}$) output from detector 102, will be substantially canceled or offset with the discharged feedback compensation charge $Q_{COMP}$. The net of the feedback compensation charge and the error charge will result in substantially no error charge upon $C_{FB}$, as shown. Moreover, the feedback leakage current from compensation controller 108 during an event will offset or cancel the leakage current associated with detector 102 while preventing integration current on $C_{FB}$. The compensation of the charge or current corresponding to the leakage current within detector 102 occurs throughout the dead time such that when OUT_CSA is sampled at the end of the dead time via TRIG_ADC, a more accurate integration of the photon current can occur. If $R_{LKG}*C_{LKG}$ is designed or trimmed to be equal to the dead time, the discharge through dynamic switching during an event will substantially cancel (less than a desired accuracy) the error charge of $Q_{LKG}$ or $Q_{ERR}$ on $Q_{IN}$ that results from detector 102 leakage current.

Similar to leakage compensation current 500 in a non-event state, leakage detector circuit 600 shown with an event controller 114, can be configured as a switched capacitor amplifier with sample and hold switches $T_S$ and $T_H$ shown in phantom block 610 applied to the first feedback path 106, actuated or toggled by a clocking signal CLK. Shown in FIG. 6, is a clocking signal with a hold phase $T_H$ that can be applied similar to an event phase of FIG. 5 upon first and second switches S1 and S2. The hold phase of the clocking signal will open switch S2 while closing switch S1, thereby discharging $C_{LKG}$ and preforming compensation similar to when an event logic one value of CLK is used to toggle switches S1 and S2. FIG. 6 thereby illustrates operation of an event logic state or a hold logic state to discharge capacitor $C_{LKG}$ when preforming compensation in a switched capacitor amplifier arrangement in which leakage on the switch capacitor detector 102 is compensated.

Figure 7:
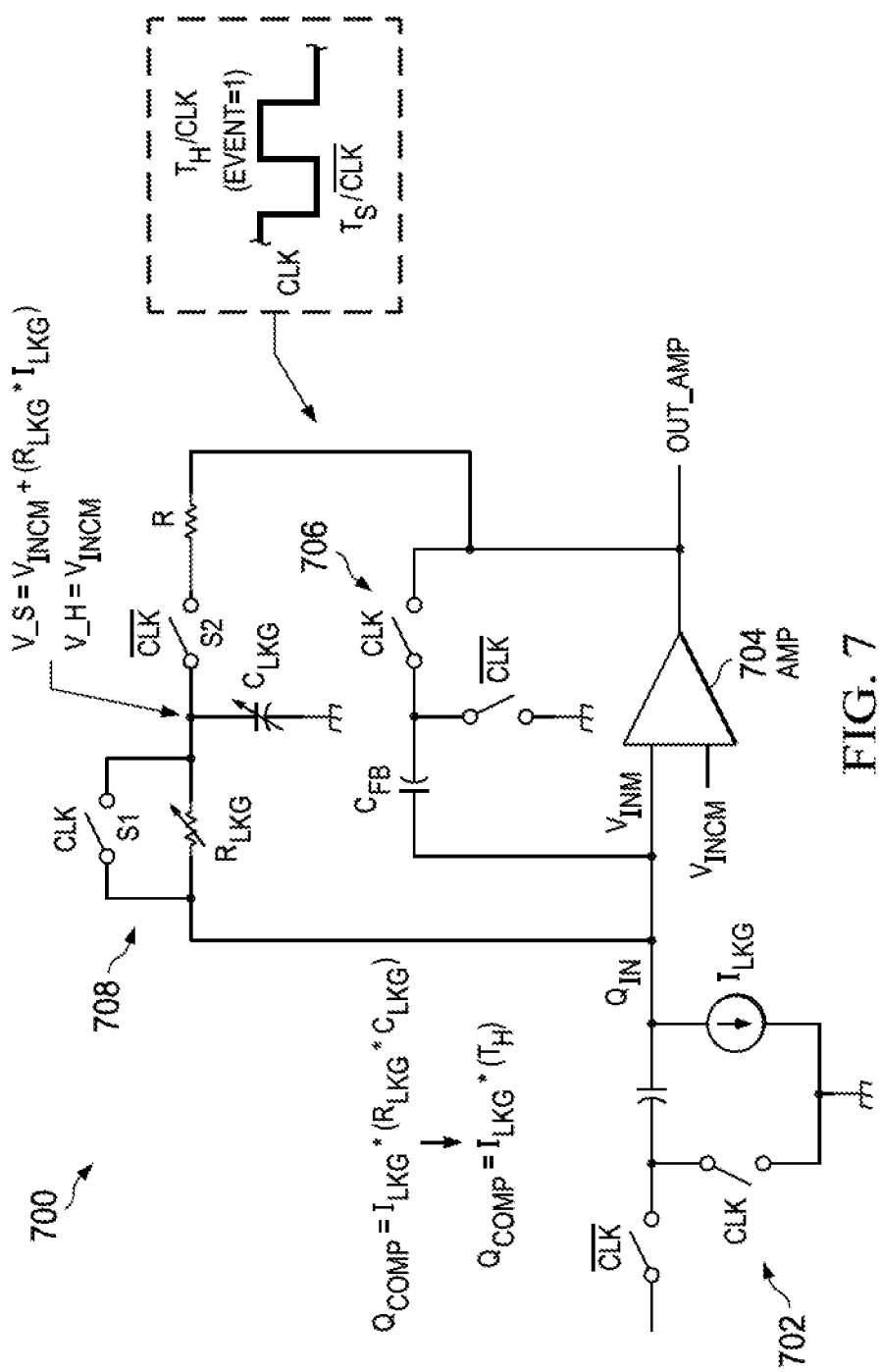
FIG. 7 shows a circuit diagram of a leakage compensation circuit including switches actuated during sample and hold states of a switched capacitor amplifier.

FIG. 7 depicts a circuit diagram of a leakage compensation circuit 700 that includes first and second switches S1 and S2 actuated during sample and hold states of a switched capacitor amplifier. A clocking signal with opposing logic states and sample and hold durations, identified as $T_S$ and $T_H$, is applied to actuate the various switches of the leakage compensation current 700. Switches marked with $\overline{CLK}$ are closed during a sample phase $T_S$ of a switched capacitor amplifier, and are alternatively referred to as $T_S$ switches. The remaining switches of circuit 700 are marked as CLK switches that are closed during a hold phase $T_H$ and can be alternatively referred to as $T_H$ switches. Leakage compensation circuit 700 includes a detector 702 that detects electrical energy, such as voltage, and samples that voltage during the sample phase by closing $\overline{CLK}$ switches or $T_S$ switches. During these sample phases, however, leakage current $I_{LKG}$ exists within detector 702 and leakage information corresponding to $I_{LKG}$ is stored on the leakage capacitor $C_{LKG}$. Leakage information can comprise voltage during the sample phase identified as $V\_S=V_{INCM}+(R_{LKG}*I_{LKG})$. During a sample phase, amplifier 704 is coupled to receive an error charge corresponding to $I_{LKG}$. A second feedback path of a compensation controller 708 coupled across amplifier 704 comprises the first switch S1 and the second switch S2. When the first switch S1 is closed during the sample phase, voltage information corresponding to the leakage current is stored on $C_{LKG}$.

During the hold phase, subsequent to the sample phase, when the CLK or $T_H$ switches are closed, the stored voltage existing during the prior sample phase or V_S upon $C_{LKG}$ is discharged. The discharged amount, or the product of $R_{LKG}$ and $I_{LKG}$, corresponds to a feedback compensation charge. $R_{LKG}*C_{LKG}$ can be trimmed so that the product substantially equals the hold time, or $T_H$, the feedback compensation charge will substantially cancel the error charge at $Q_{IN}$ caused by the leakage current $I_{LKG}$.

OUT_AMP is sampled or converted at the end of the hold time, or $T_H$, similar to the sampling via TRIG_ADC of OUT_CSA shown in FIGS. 2 and 6. Also, similar to $R_{LKG}$ and $C_{LKG}$ of the leakage compensation systems 500 and 600 of FIGS. 5 and 6, respectively, $R_{LKG}$ and $C_{LKG}$ of the leakage compensation circuit 700 can be variably programmed, or trimmed, such that their product substantially equals $T_H$. Moreover, $T_H$ and the clocking signal in which $T_H$ is applied to compensation controller 708 operates similar to when an event is present on the similarly configured compensation controller 108 of leakage compensation system 600 (FIG. 6). Also, similar to leakage compensation system 600 of FIG. 6, is a first feedback path 706 having a feedback capacitor $C_{FB}$. The feedback compensation charge $Q_{COMP}$ during a hold time will substantially prevent improper current integrated upon $C_{FB}$ by substantially canceling any error charge applied to $C_{FB}$ during a hold phase.

The feedback path of a compensation controller 708 used in a switched capacitor amplifier application therefore utilizes first and second switches S1, S2 that toggle on different phases of the clocking signal to operate similar to first and second switches S1 and S2 of a compensation controller 108 within a photon counting application. Both applications, through use of compensation controllers 108, 708, discharge feedback compensation charge to cancel any error charge that would be integrated onto a feedback capacitor (in the first feedback path). Both applications also use first and second switches S1 and S2 to discharge a feedback leakage current to offset any error charge on the amplifier input $V_{INM}$ during either a dead time $T_{DEAD}$ or during a hold time $T_H$.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A circuit comprising:
   an input terminal configured to receive a detector signal, wherein the detector signal includes an error charge;
   an amplifier having an input and an output wherein the input of the amplifier is coupled to the input terminal; and
   a feedback path having an input and an output wherein the input of the feedback path is coupled to the output of the amplifier, the output of the feedback path is coupled to the input of the amplifier;
   wherein the feedback path comprises a leakage resistor having a first terminal and a second terminal where in the first terminal of the leakage resistor is coupled to the output of the feedback path;
   wherein the feedback path further comprises a first switch having a first terminal and a second terminal where in the first terminal of the first switch is coupled to the output of the feedback path and the second terminal of the first switch is coupled to the to the second terminal of the leakage resistor;
   wherein the feedback path further comprises a leakage capacitor having a first terminal and a second terminal where in the first terminal of the leakage capacitor is coupled to the second terminal of the leakage resistor and the second terminal of the leakage capacitor is coupled to ground;
   wherein the feedback path further comprises a second switch having a first terminal and a second terminal where in the first terminal of the second switch is coupled to the first terminal of the leakage capacitor and the second terminal of the second switch is coupled to the input of the feedback path.

2. The circuit of claim 1, wherein the leakage capacitor is charged when the output of the amplifier is less than a predetermined threshold.

3. The circuit of claim 2, wherein the circuit further comprises a filter having an input and an output wherein the input of the filter is coupled to the output of the amplifier.

4. The circuit of claim 1, wherein the leakage capacitor is charged when a phase of a clock changes.

5. A circuit comprising:
   an input terminal configured to receive a detector signal, wherein the detector signal includes an error charge;
   an amplifier having an input and an output wherein the input of the amplifier is coupled to the input terminal; and
   a feedback path having an input and an output wherein the input of the feedback path is coupled to the output of the amplifier, the output of the feedback path is coupled to the input of the amplifier;
   wherein the feedback path comprises a leakage resistor having a first terminal and a second terminal where in the first terminal of the leakage resistor is coupled to the output of the feedback path;
   wherein the feedback path further comprises a first switch having a first terminal and a second terminal where in the first terminal of the first switch is coupled to the output of the feedback path and the second terminal of the first switch is coupled to the to the second terminal of the leakage resistor;
   wherein the feedback path further comprises a leakage capacitor having a first terminal and a second terminal where in the first terminal of the leakage capacitor is coupled to the second terminal of the leakage resistor and the second terminal of the leakage capacitor is coupled to ground;
   wherein the leakage capacitor is discharged when a voltage at the output of the amplifier exceeds a predetermined threshold.

6. The circuit of claim 5, wherein the circuit further comprises a filter having an input and an output wherein the input of the filter is coupled to the output of the amplifier.

7. A circuit comprising:
   an input terminal configured to receive a detector signal, wherein the detector signal includes an error charge;
   an amplifier having an input and an output wherein the input of the amplifier is coupled to the input terminal; and
   a feedback path having an input and an output wherein the input of the feedback path is coupled to the output of the amplifier, the output of the feedback path is coupled to the input of the amplifier;
   wherein the feedback path comprises a leakage resistor having a first terminal and a second terminal where in the first terminal of the leakage resistor is coupled to the output of the feedback path;
   wherein the feedback path further comprises a first switch having a first terminal and a second terminal where in the first terminal of the first switch is coupled to the output of the feedback path and the second terminal of the first switch is coupled to the to the second terminal of the leakage resistor;
   wherein the feedback path further comprises a leakage capacitor having a first terminal and a second terminal where in the first terminal of the leakage capacitor is coupled to the second terminal of the leakage resistor and the second terminal of the leakage capacitor is coupled to ground;
   wherein the leakage capacitor is discharged when a phase of a clock changes.

8. A circuit comprising:
   an input terminal configured to receive a detector signal, the detector signal to include an error charge;
   an amplifier having an input and an output wherein the input of the amplifier is coupled to the input terminal;
   a feedback capacitor having a first terminal and a second terminal wherein the first terminal of the feedback capacitor is coupled to the amplifier input and the second terminal of the feedback capacitor is coupled the amplifier output;
   a feedback path having a first terminal and a second terminal wherein the first terminal of the feedback path is coupled to the amplifier input and the second terminal of the feedback path is coupled to the amplifier output, the feedback path comprising:
   a first switch having a first terminal and a second terminal;
   a leakage resistor having a first terminal and a second terminal wherein the first terminal of the leakage resistor is coupled to the first terminal of the first switch and the second terminal of the leakage resistor is coupled to the second terminal of the first switch;

a leakage capacitor having a first terminal and a second terminal wherein the first terminal of the leakage capacitor is coupled to the second terminal of the first switch and the second terminal of the leakage capacitor is coupled to ground.

9. The circuit of claim 8, wherein the first switch in response to a first signal closes and discharges a feedback leakage current through the first switch and into the amplifier input.

10. The circuit of claim 9, wherein the first signal comprises a logic state generated from a comparator having a predetermined trigger voltage applied to one input of the comparator.

11. The circuit of claim 9, wherein the first signal comprises a logic state maintained during a dead time.

12. The circuit of claim 9, wherein the first signal comprises a logic state maintained during a hold time.

13. The circuit of claim 9, wherein the leakage capacitor comprises a variable capacitor or the leakage resistor comprises a variable resistor.

* * * * *